US011584083B2

(12) United States Patent
Toledano et al.

(10) Patent No.: US 11,584,083 B2
(45) Date of Patent: Feb. 21, 2023

(54) METHOD AND SYSTEM OF ADDITIVE MANUFACTURING CONTOUR-BASED HATCHING

(71) Applicant: GENERAL ELECTRIC COMPANY, Schenectady, NY (US)

(72) Inventors: David S. Toledano, Niskayuna, NY (US); Jason Harris Karp, Portland, ME (US); William T. Carter, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 590 days.

(21) Appl. No.: 16/584,061

(22) Filed: Sep. 26, 2019

(65) Prior Publication Data

US 2021/0094235 A1 Apr. 1, 2021

(51) Int. Cl.
*G06T 15/00* (2011.01)
*B29C 64/386* (2017.01)
(Continued)

(52) U.S. Cl.
CPC .......... *B29C 64/386* (2017.08); *B23P 6/007* (2013.01); *B33Y 50/00* (2014.12);
(Continued)

(58) Field of Classification Search
CPC ............. F05D 2220/30; F05D 2230/80; F05D 2230/31; F05D 2230/22; B33Y 50/02;
(Continued)

(56) References Cited

U.S. PATENT DOCUMENTS 6,600,965 B1 7/2003 Hull et al.
6,699,424 B2 3/2004 Nguyen et al.
(Continued)

FOREIGN PATENT DOCUMENTS

| CN | 106200559 A | 12/2016 |
|---|---|---|
| CN | 108648220 A | 10/2018 |
| CN | 108889948 A | 11/2018 |

OTHER PUBLICATIONS

He S, Zeng X, Yan C, Gong H, Lee CH. Tri-Dexel model based geometric simulation of multi-axis additive manufacturing. InInternational Conference on Intelligent Robotics and Applications Aug. 16, 2017 (pp. 819-830). Springer, Cham.*
(Continued)

*Primary Examiner* — Phu K Nguyen
(74) *Attorney, Agent, or Firm* — Dority & Manning, P.A.

(57) ABSTRACT

A system and method including receiving a data model representation of a part, the data model representation including at least one layer of the part and inner and outer contours for the at least one layer; determining a hatch pattern for each layer of the at least one layer of the part, the hatch pattern for each layer being dependent on the inner and outer contours for each respective layer; generating a record of the determined hatch pattern for each layer, the record including locations for the hatch pattern for each layer; and saving the record of the determined hatch pattern for each layer of the part. In some aspects, the record of the determined hatch pattern for each layer of the part may be used in an additive manufacturing process.

20 Claims, 18 Drawing Sheets

(51) Int. Cl.
*B33Y 50/00* (2015.01)
*G05B 19/4099* (2006.01)
*B23P 6/00* (2006.01)
*G06F 30/00* (2020.01)
*G06T 17/00* (2006.01)

(52) U.S. Cl.
CPC ......... *G05B 19/4099* (2013.01); *G06F 30/00* (2020.01); *G06T 17/00* (2013.01); *G05B 2219/35134* (2013.01); *G05B 2219/49007* (2013.01)

(58) Field of Classification Search
CPC ......... B33Y 30/00; B33Y 10/00; B33Y 50/00; B22F 2007/068; B22F 5/10; B22F 10/00; B22F 10/10; B22F 85/04; F01D 5/005; Y02P 10/25; B29C 64/386; G05B 2219/49007; G05B 2219/35134; G05B 19/4099; B23P 6/007
USPC ......................................................... 345/418
See application file for complete search history.

(56) References Cited

U.S. PATENT DOCUMENTS

| | | |
|---|---|---|
| 9,522,426 B2 | 12/2016 | Das et al. |
| 10,191,476 B2 | 1/2019 | Revanur et al. |
| 10,337,335 B2 | 7/2019 | Pavlov et al. |
| 2014/0099476 A1* | 4/2014 | Subramanian ....... B23K 26/342 428/164 |
| 2018/0250774 A1* | 9/2018 | Symeonidis ....... B23K 26/0626 |
| 2019/0113907 A1 | 4/2019 | Roychowdhury et al. |
| 2019/0163167 A1 | 5/2019 | Roychowdhury et al. |

OTHER PUBLICATIONS

Singh S, Ramakrishna S, Singh R. Material issues in additive manufacturing: A review. Journal of Manufacturing Processes. 2017; 25:185-200.*

Livesu M, Ellero S, Martínez J, Lefebvre S, Attene M. From 3D models to 3D prints: an overview of the processing pipeline. InComputer Graphics Forum May 2017 (vol. 36, No. 2, pp. 537-564).*

Paul CP, Jinoop AN, Bindra KS. Metal additive manufacturing using lasers. Additive Manufacturing: Applications and Innovations. Sep. 13, 2018:37-94.*

Taufik M, Jain PK. Computer aided visualization tool for part quality analysis of additive manufacturing process. InInternational Design Engineering Technical Conferences and Computers and Information in Engineering Conference Aug. 21, 2016 (vol. 50107, p. V02AT03A034). American Society of Mechanical Engineers.*

Asiabanpour, Bahram et al., "Advancements in the selective inhibition sintering process development", Virtual and Physical Prototyping, vol. 01, Issue: 01, Feb. 16, 2007, ISSN: 1745-2759, DOI 10.1080/17452750500289910, (pp. 43-52, 11 total pages).

Senthilkumaran, K. et al., "New model for shrinkage compensation in selective laser sintering", Virtual and Physical Prototyping, vol. 04, Issue: 02, Jul. 8, 2009, ISSN: 1745-2759, DOI: 10.1080/17452750802393659, (pp. 49-62, 15 total pages).

* cited by examiner

US 11,584,083 B2

METHOD AND SYSTEM OF ADDITIVE MANUFACTURING CONTOUR-BASED HATCHING

BACKGROUND

The field of the present disclosure generally relates to additive manufacturing, and more particularly, to a method and system of generating contour-based hatching for a part to be produced by an additive manufacturing process.

Additive manufacturing (AM) fabricated parts may be used in applications (e.g., aerospace, medical, industrial, and other applications) demanding high quality and accuracy of the AM fabricated parts. As an example, some metal alloys of commercial interest are difficult to build using direct metal laser melting (DMLM) techniques because of the high risk of the formation of microcracks in the parts, which degrades the quality of the parts fabricated by DMLM. In some aspects, the risk of a crack might be greater in thin or narrow regions of the parts. Laser hatch lines used to build a part by DMLM are conventionally generated at one or more fixed angles across a surface of the part being fabricated, irrespective of the geometry of the part itself. Given a typical part might include a variety of contour angles and bends, the laser hatch lines for a DMLM part might typically intersect the part at many different incidence angles.

In some instances, laser hatching might be used to improve the quality of an AM fabricated part. However, a major challenge exists in determining the hatching for different part shapes and contours that reduces or minimizes the possibility of cracking in the fabricated part.

DETAILED DESCRIPTION

Embodying systems and methods herein relate to Additive Manufacturing (AM) systems that, in general, produce a three-dimensional (3D) object or assembly by printing materials under computer control. AM processes and systems may successively add materials, for example in layers, to create the three-dimensional assembly or object based on 3D CAD model data (i.e., a specification) of the part. In general, AM fabricated objects, assemblies or parts (as generally referred to herein) generated using DMLM might include generating scan paths (i.e., hatches) to reduce or minimize the risk of cracking during the laser-welding of, for example, thin sections and/or in crack-prone alloys.

In some embodiments herein, scan paths (i.e., hatches) for each build layer of a part to be fabricated by an AM process may be defined with respect to a skeleton (i.e., midline) of the part. Since the skeleton varies in correspondence with the contours of the part, the hatches herein are generated based on the contours of the part. In some embodiments, the hatches for a build layer of the part might be drawn normal (or some other determined angle) to the skeleton.

Figure 1:
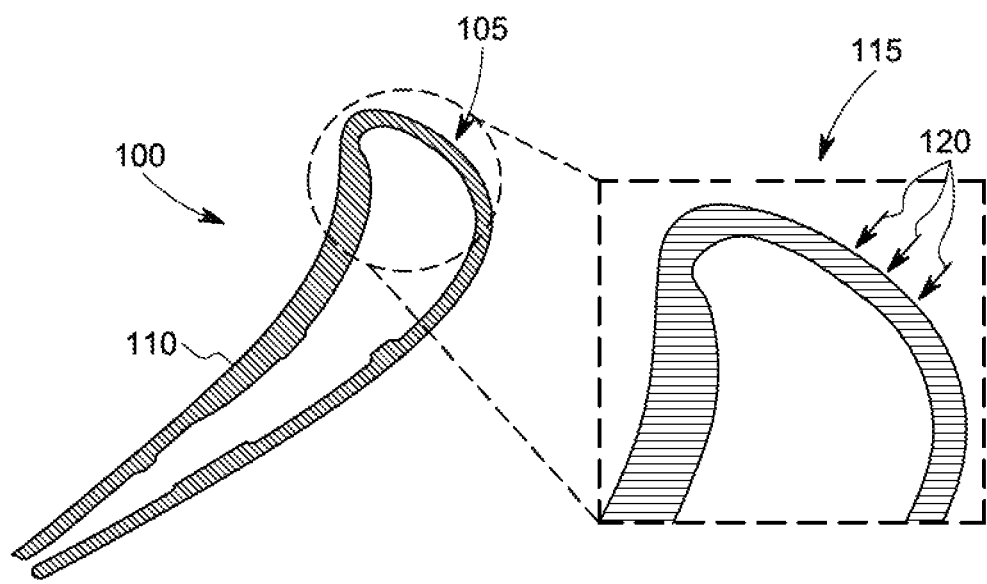
FIG. 1 is an illustrative example of part with conventional, fixed angle hatches in a part.

FIG. 1 is an illustrative depiction of a conventional method for defining hatches or laser marking locations for DMLM, wherein all of the hatches are aligned at a constant angle, irrespective of the contours or shape of the part. Shown in FIG. 1 is a layer 100 of a part, including hatches 110. Region 105 of layer 100 is shown in greater detail at 115. As seen at 115, all of the hatches 110 are drawn at the same angle (e.g., approximately 45 degrees from an upper-left location to a lower-right location). In the region 120, the hatches generally run parallel to the contours of the part. As a result, this area (and other similar areas) of the part are at an increased risk of crack formation.

Figure 2:
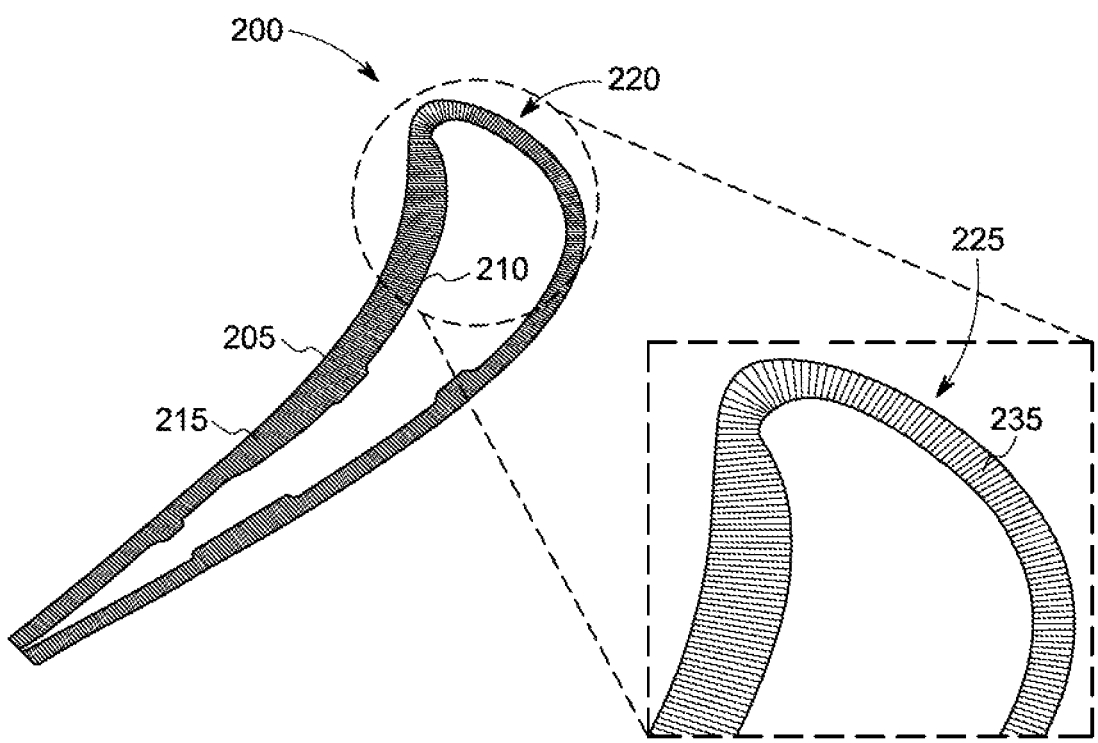
FIG. 2 is an illustrative depiction of some aspects of contour-based hatching of some embodiments herein.

FIG. 2 is an illustrative depiction of a novel method for defining hatches or laser marking locations for DMLM, wherein the hatches are not aligned at a constant angle. In FIG. 2, the hatches are defined based on the contours of the part. FIG. 2 includes an illustrative layer 200 of a part having outer contour 205 and inner contour 210 defining the boundaries of the part and hatches 215 filling the interior of the part, extending between the boundaries. Region 220 of layer 200 is shown in greater detail at 225. As seen at 225, the hatches 235 are drawn at different angles, wherein the orientation of the hatches are shown adjusted to match the contours of the part. As shown, and in contrast to FIG. 1, the hatches in region 225 do not run parallel to the contours of the part. As a result, this area (and all other areas of layer 200) of the part are at a reduced or minimized risk of crack formation.

In some aspects, a number of objectives might be considered and balanced regarding the hatching configurations in some embodiments herein. In some examples, the competing objectives might include, one or more of, defining hatches that are, in some embodiments, approximately normal to the contours of the part; maintaining even spacing between successive hatches (e.g., even center-to-center distances between successive hatches); and avoiding sudden (i.e., discontinuous) changes in orientations between successive hatches, to the extent possible. In some instances, more, fewer, alternate, or different objectives and considerations may factor into a determination of the configuration of the hatches for a layer of a part.

Figure 3:
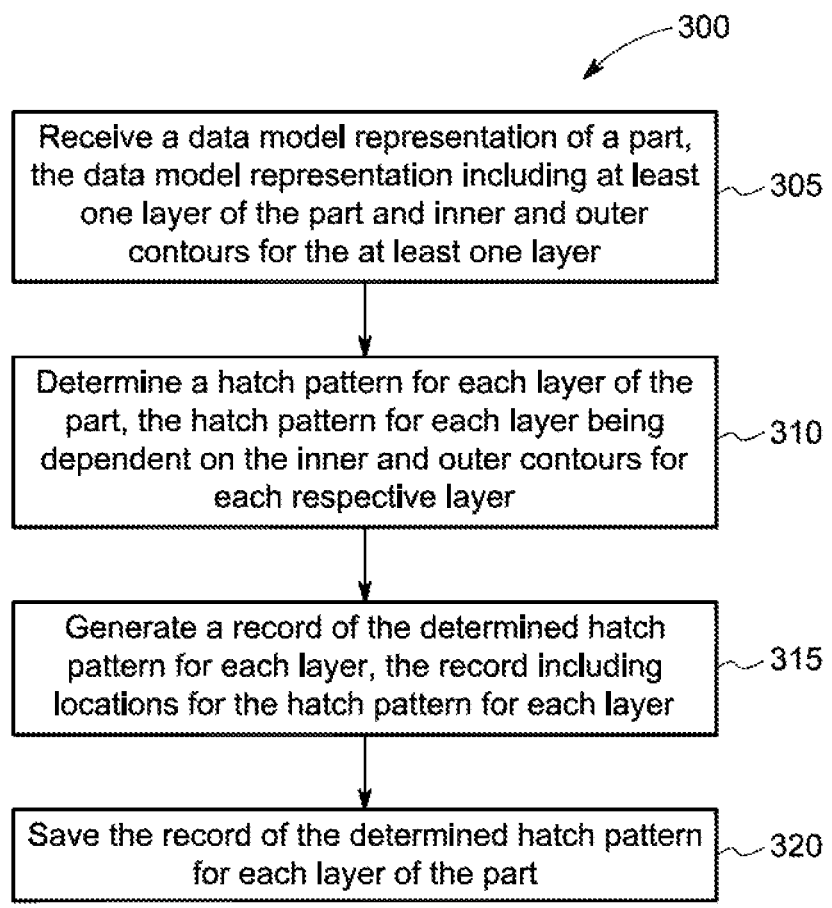
FIG. 3 is an illustrative flow diagram of a contour-based hatching process, in accordance with some embodiments.

FIG. 3 is an illustrative flow diagram of a contour-based hatching process 300, in accordance with some embodiments. It is noted that a number of steps, operations and actions might occur prior to operation 305, in an effort to prepare, generate, or otherwise determine a data model representation of a part that is received at operation 305. In one example scenario, a three-dimensional (3D) representation of an assembly may be generated and saved as a computer aided design, CAD, file (e.g., a StereoLithography format, SLI, file). The particular portion of the assembly to be fabricated by DMLM (i.e., the 3D part) may be derived from the CAD file and the 3D part may be "sliced" into a plurality of two-dimensional layers and saved to a file (e.g., a Structured Vector Graphics, SVG, format), from which each layer may be successively generated by DMLM to fabricate the part. The file including the plurality of layers of the part may comprise the data model representation of the part received at operation 305. Each layer of the part includes data defining the inner and outer contours of the part for that respective layer.

Figure 4:
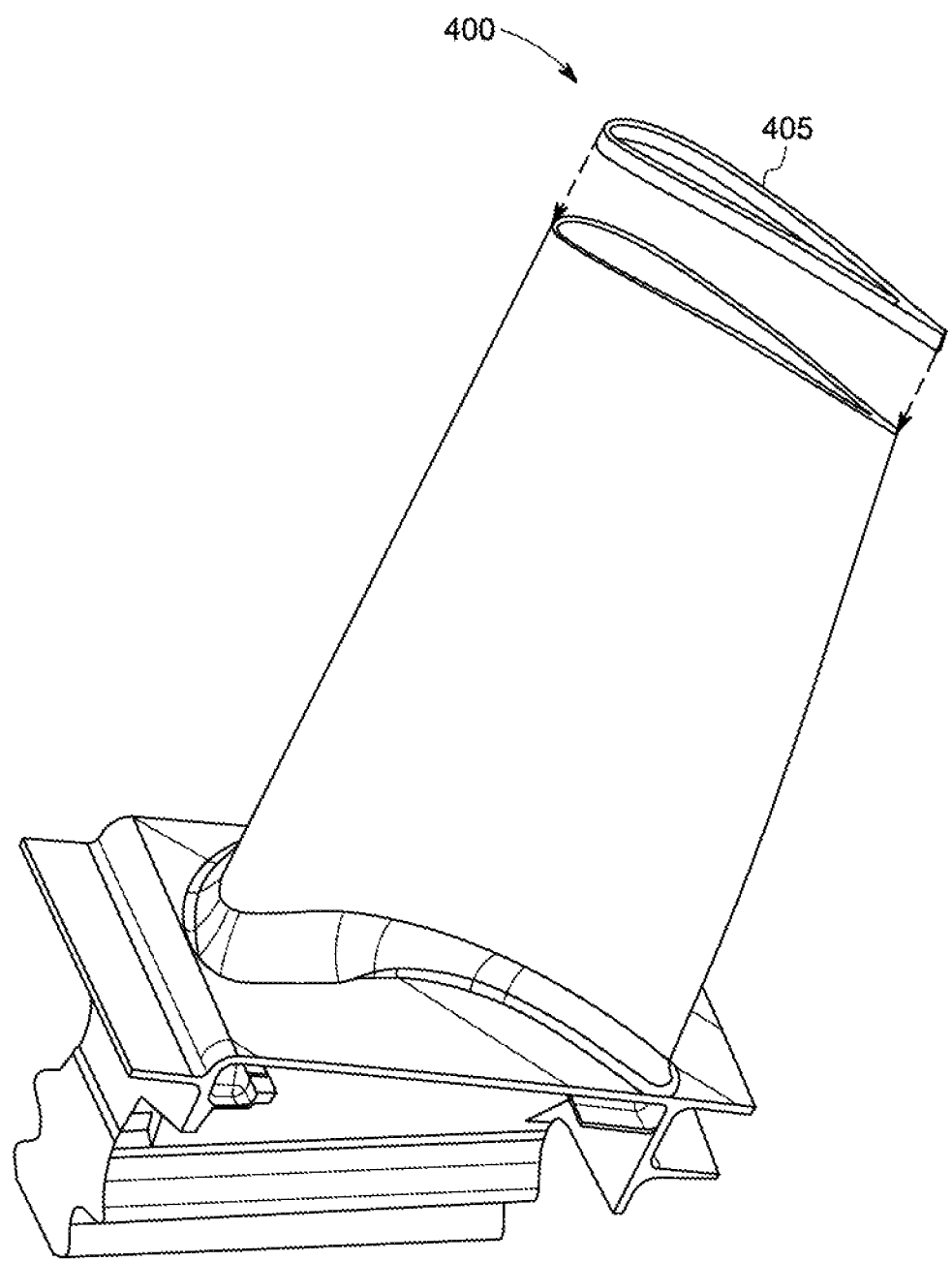
FIG. 4 is an illustrative depiction of part that might be fabricated by an AM process using some aspects of a contour-based hatching process, in accordance with some aspects of an example process herein.

FIG. 4 is an illustrative depiction of an assembly 400 (e.g., a High Pressure Turbine (HPT) blade, 70 mm overall height) including a part 405 (e.g., a 2.5 mm high tip (i.e., squealer) of the HPT blade to be replaced in an example repair scenario) that will be produced by DMLM.

Figure 5A:
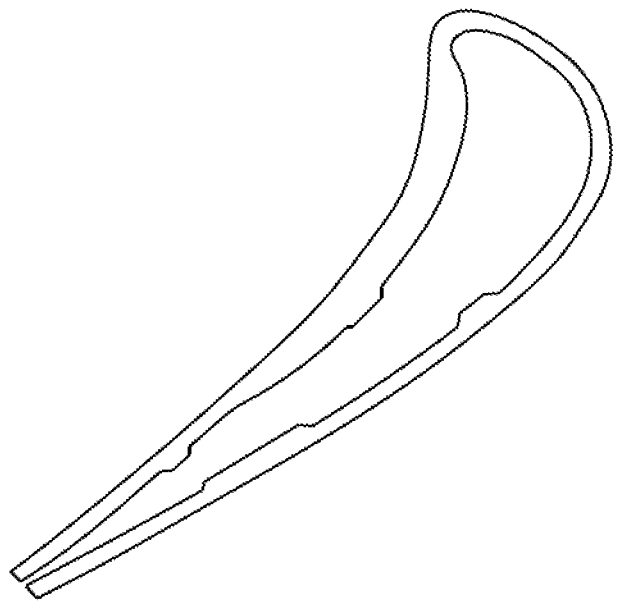
FIGS. 5A-5C are illustrative layers of a part, in accordance with some embodiments herein.
Figure 5B:
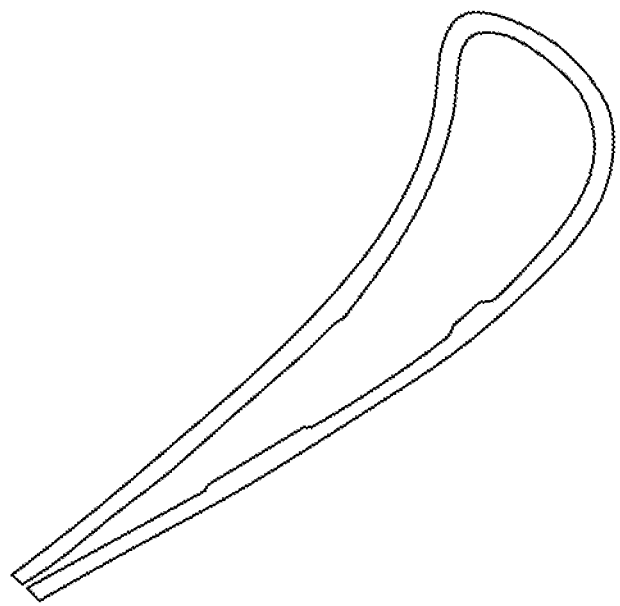
Figure 5C:
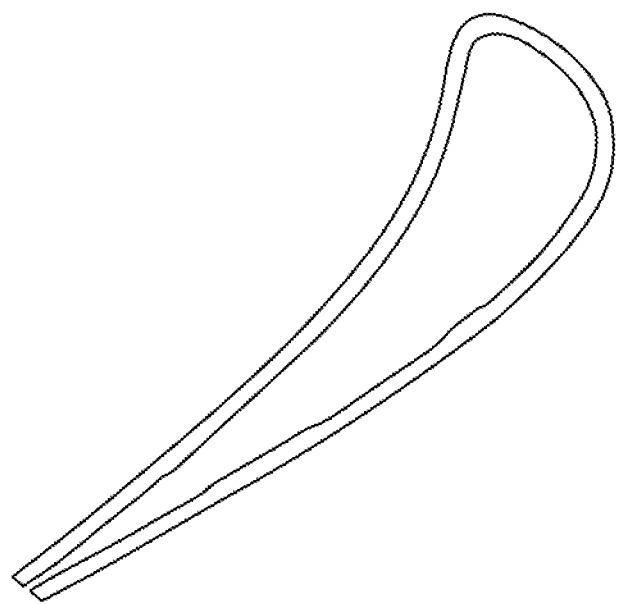

FIGS. 5A-5C are illustrative depictions of different layers of an example part herein. For example, FIG. 5A is an illustrative outline of a bottom-most layer (i.e., layer 1 out of 85, where each layer is 0.03 mm thick) of part 405 in FIG. 4; FIG. 5B is an illustrative outline of an intermediate layer (i.e., layer 43 out of 85) of part 405; and FIG. 5C is an illustrative outline of a top-most layer (i.e., layer 85 out of 85) of part 405 in FIG. 4. It is noted that the number of layers and/or thickness thereof in the example of FIGS. 5A-5C are merely illustrative, and not limiting herein.

Referring to FIG. 3, in one embodiment the data model representation of the part received at operation 305 might include a file including all of the layers of the part (i.e., 85 in the example of FIGS. 5A-5C, including the individual layers not shown), wherein information specifying the inner and outer contours of each layer is included in the data model representation.

At operation 310, a hatch pattern for each of layer of the part is determined. The hatch pattern in embodiments herein is dependent on the inner and outer contours of the part (i.e., the contour or shape of the part) and is determined for each layer since each layer may differ from other layers, including adjacent layers. The determination of the hatch pattern for each layer may include a number of steps, operations, and mathematical, analytical, and other techniques and/or algorithms, which will be disclosed in greater detail below.

At operation 315, a record of the hatch pattern determined for each layer at operation 310 is generated. The record generated at operation 315 includes, at least, the locations (i.e., configuration) of the start and stop of each hatch pattern for each layer of the part.

At operation 320, in response to the generation of the record, the record is saved to a data storage device (e.g., a non-transitory storage media), system (e.g., database, etc.), or service (e.g., a cloud-based service, etc.). The record may be embodied in a data structure in one or more file configurations, where the data structure and/or file configurations may include those now known (e.g., Common Layer Interface (CLI) etc.) and those that become known in the future.

Figure 6:
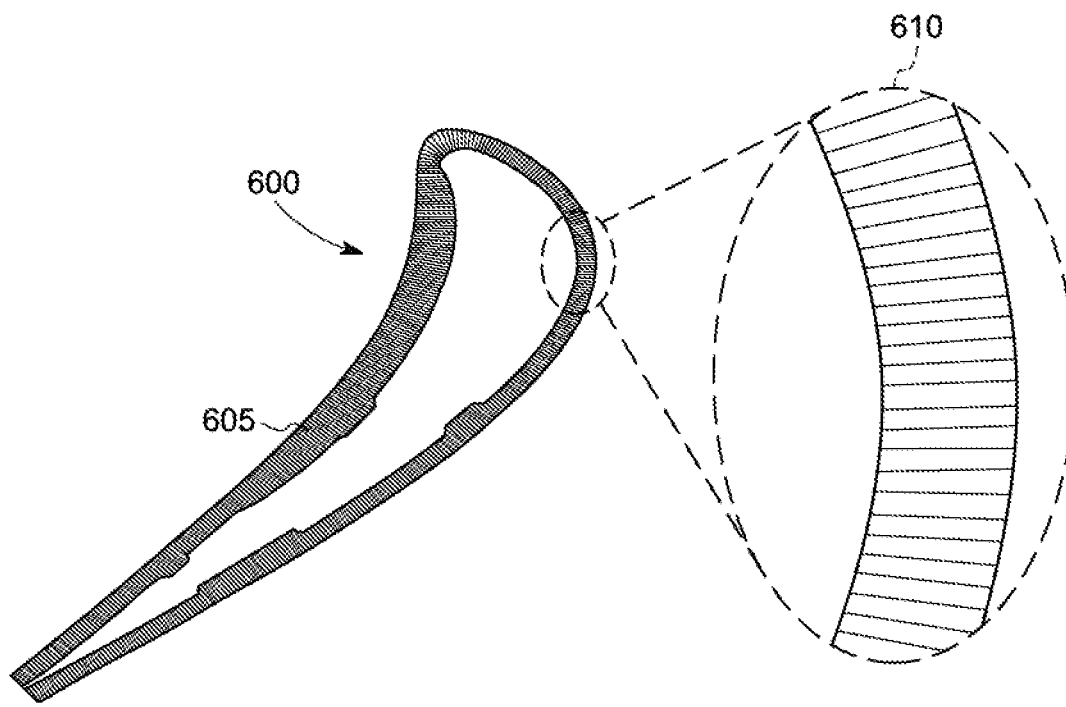
FIG. 6 is an illustrative depiction of some aspects of contour-based hatching of some embodiments herein.

FIG. 6 is an illustrative depiction of one layer 600 of a part, including hatch pattern locations as specified in a record in accordance with some embodiments herein (e.g., FIG. 3, operation 320). Layer 600 is just one layer of the multiple layers specified in the record. In the example of FIG. 6, layer 600 is layer 1 of 85 layers comprising the part where the hatch pattern 605 occupies an interior space defined by the contours or boundaries of the part. A detailed view of the hatch locations for the example of FIG. 6 is shown at 610. In the detailed view, it is seen that the individual hatch marks are not all configured with a same angle or orientation across the part. Instead, the hatch marks vary in orientation as the contour of the part changes. In the example of FIG. 6, each hatch mark is configured approximately normal to the changing contours of the part. In one aspect, the hatches may be evenly spaced apart from each other as demonstrated in FIG. 6.

Figure 7:
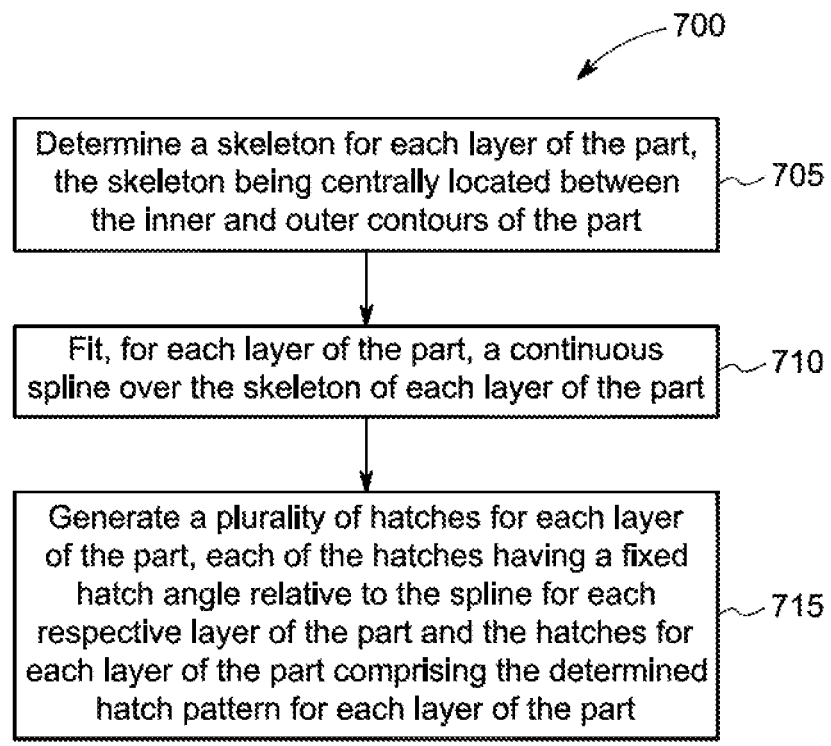
FIG. 7 is an illustrative flow diagram of some aspects of contour-based hatching process, in accordance with some embodiments.
Figure 8A:
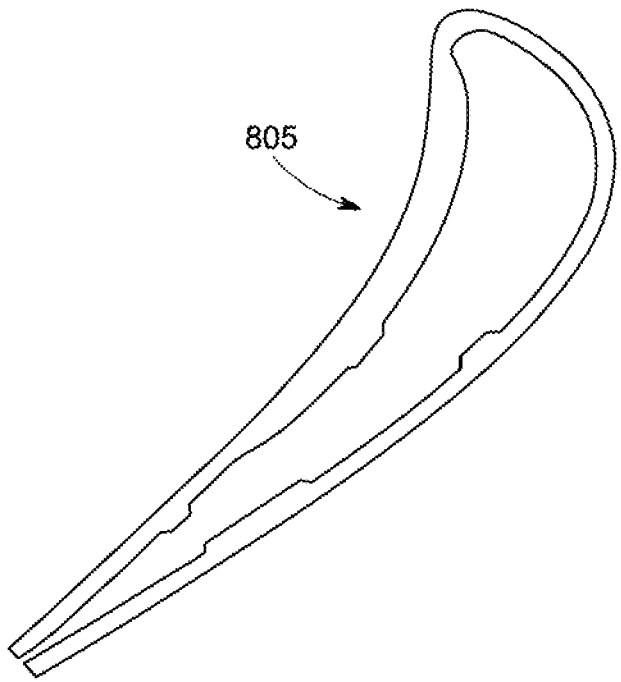
FIGS. 8A-8E are illustrative depictions of some aspects of a contour-based hatching process, in accordance with some embodiments.
Figure 8B:
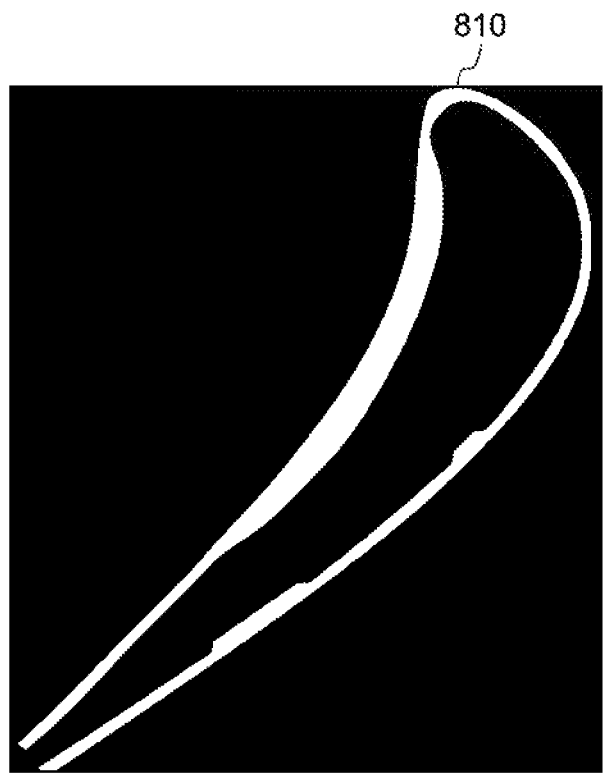
Figure 8C:
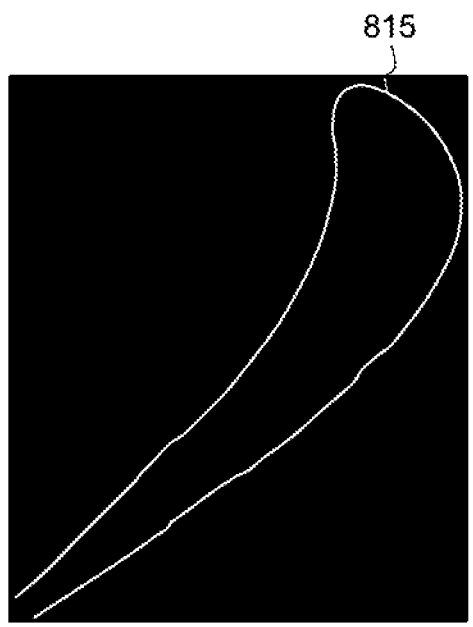

FIG. 7 is an example of a contour-based hatching process 700, in accordance with some embodiments herein. In some aspects, process 700 may represent a process to determine a hatch pattern for each layer of a part, as disclosed herein (e.g., operation 310 of process 300). At operation 705, a skeleton for each layer of the part is determined, where the skeleton is centrally located between the inner and outer contours of the part, at about a mid-line of the part. In one embodiment, a data model representation (e.g., FIG. 8A, 805; a SVG image) of a layer of the part is "rastered" into a binary image (e.g., FIG. 8B, 810; a 380×300 pixel image) of the single layer and the binary image is processed to compute or otherwise determine a 1-pixel wide skeleton of the binary image (e.g., FIG. 8C, 815).

Figure 8D:
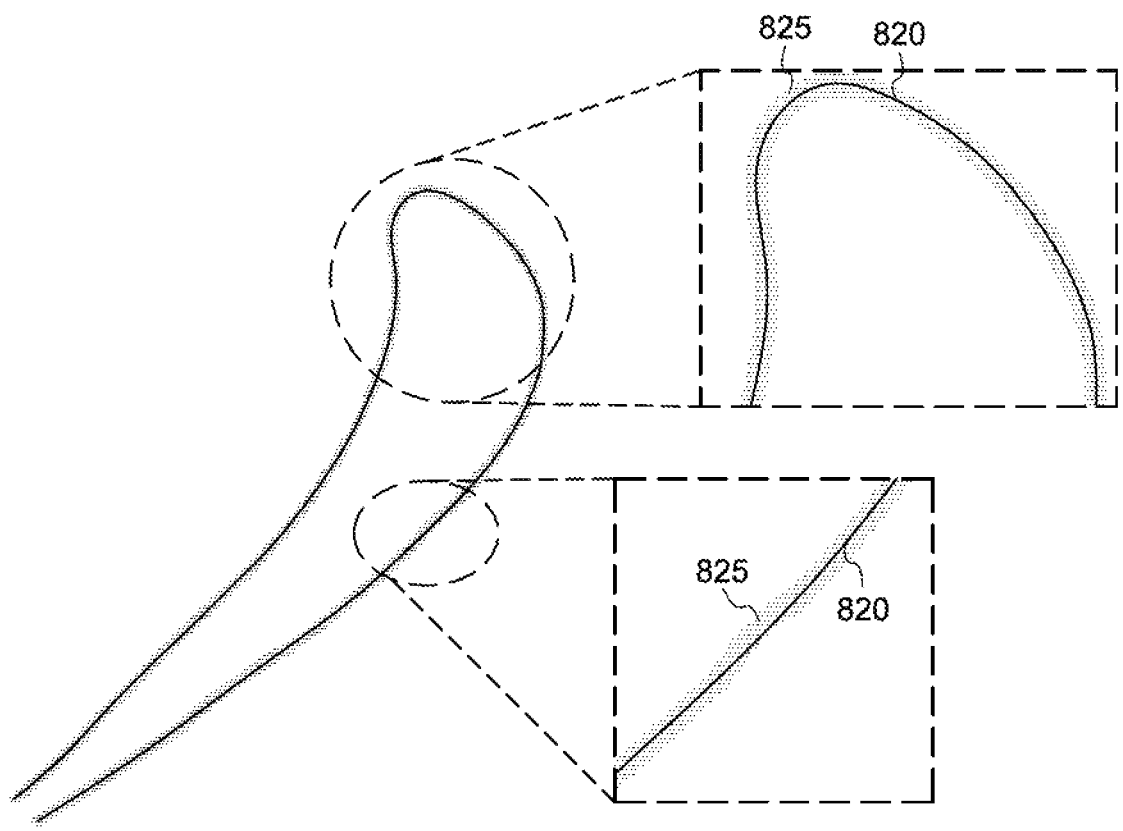

At operation 710, the skeleton determined for each layer is fit to a continuous, univariate spline for the respective layer of the part. FIG. 8D is an illustrative depiction of a skeleton 825 and a spline 820 overlay on the skeleton. In the example of FIG. 8D, the spline has been smoothed to minimize abrupt changes therein. For example, the detailed view illustrates how a smoothing factor permits the spline to "ignore" minor variances in the skeleton and contours, and thereby obtain a smooth variation of the hatching angle (with lower variance than the rastered skeleton itself).

Figure 8E:
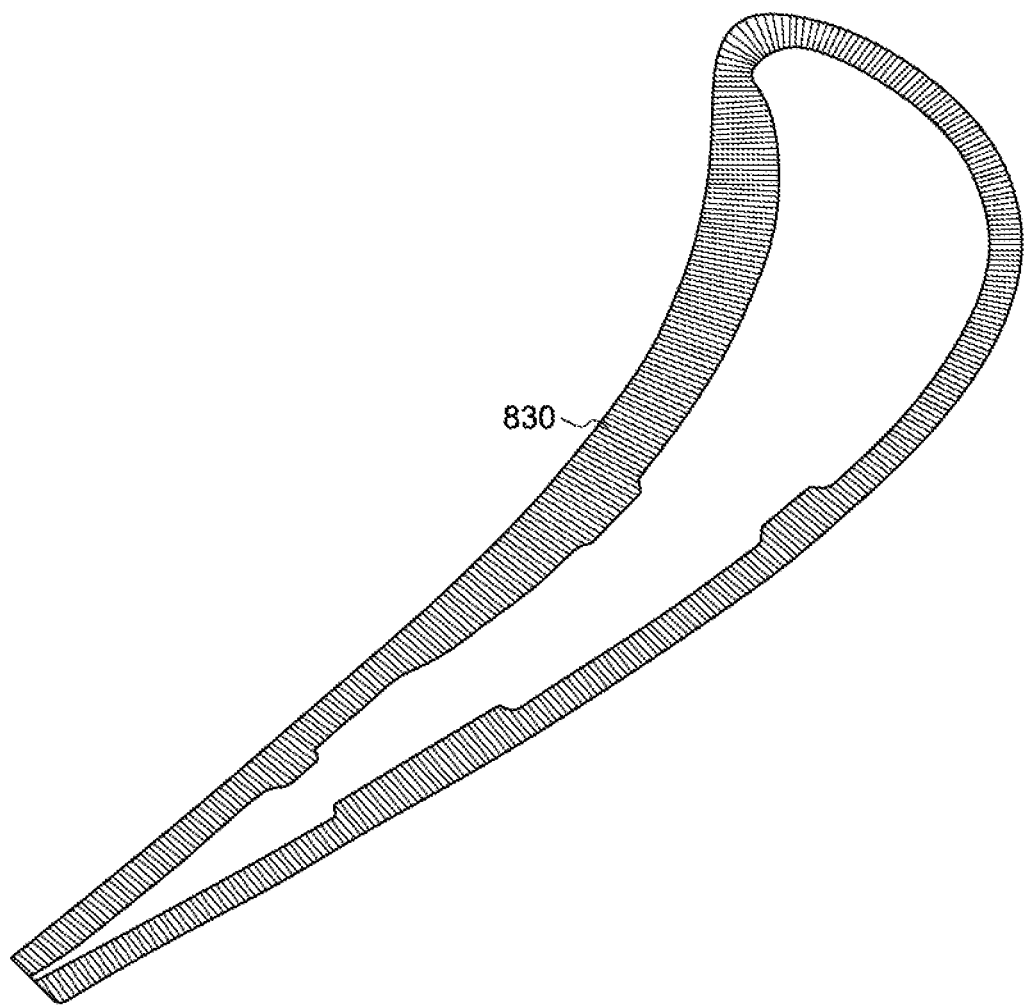

At operation 715, a plurality of hatches for each layer of the part is generated. In some embodiments, each of the plurality of hatches for a particular layer of the part are configured with a fixed hatch angle relative to or with respect to the spline of each respective layer, where the plurality of hatches comprise a hatch pattern (e.g., FIG. 3, 310) that may be saved and used in other processes, such as but not limited to a DMLM fabrication of the part. FIG. 8E is an illustrative depiction of an output of hatches for one example layer of an example part herein. In the example of FIG. 8E, the hatches 830 are configured normal to the spline of the layer at evenly spaced-art intervals (e.g., 40 µm).

Figure 9:
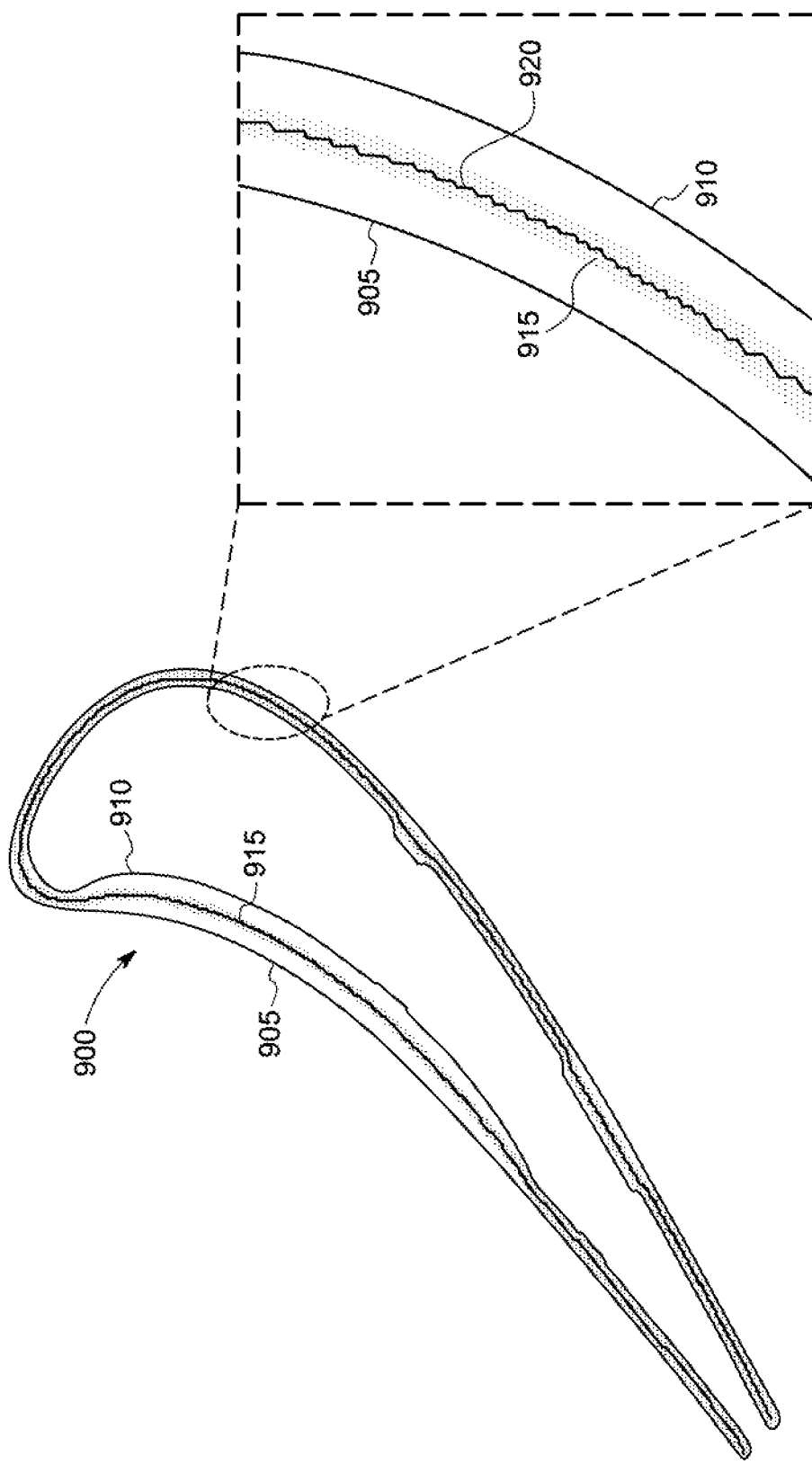
FIG. 9 is an illustrative depiction of some aspects of contour-based hatching process, including spline smoothing, in accordance with some embodiments.
Figure 10:
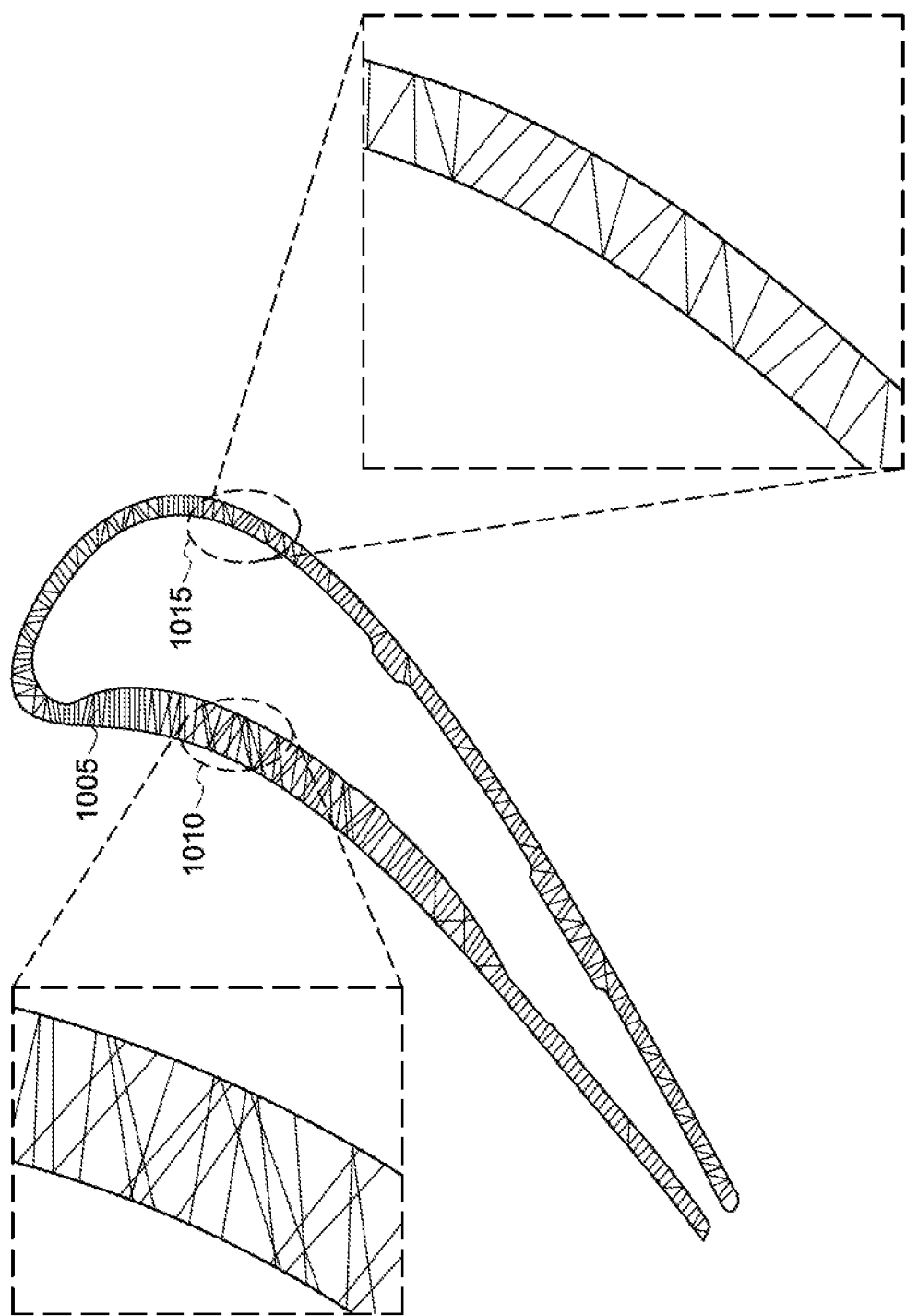
FIG. 10 is an illustrative depiction of badly aligned hatches.

In some aspects, a spline determined for each layer of a part may be subjected to or undergo a smoothing process, if need be, to avoid discontinuous hatch angles. FIG. 9 is an illustrative depiction of a layer 900 of a part, including the outer and inner contours 905 and 910 of the part, a skeleton 915, and a spline 920. As seen in the detailed view of FIG. 9, spline 920 exhibits discontinuous shifts. FIG. 10 is an illustrative depiction of hatches that might result based on spline 920. Given the discontinuous spline 920, hatches drawn normal to spline 920 would vary greatly at successive locations. These aspects are illustrated in FIG. 10, where hatches 1005 for a layer of a part having a discontinuous spline (not shown, for clarity) are shown. As shown in the detailed view of regions 1010 and 1015, the successive hatches based on the discontinuous spline are poorly aligned.

Figure 11A:
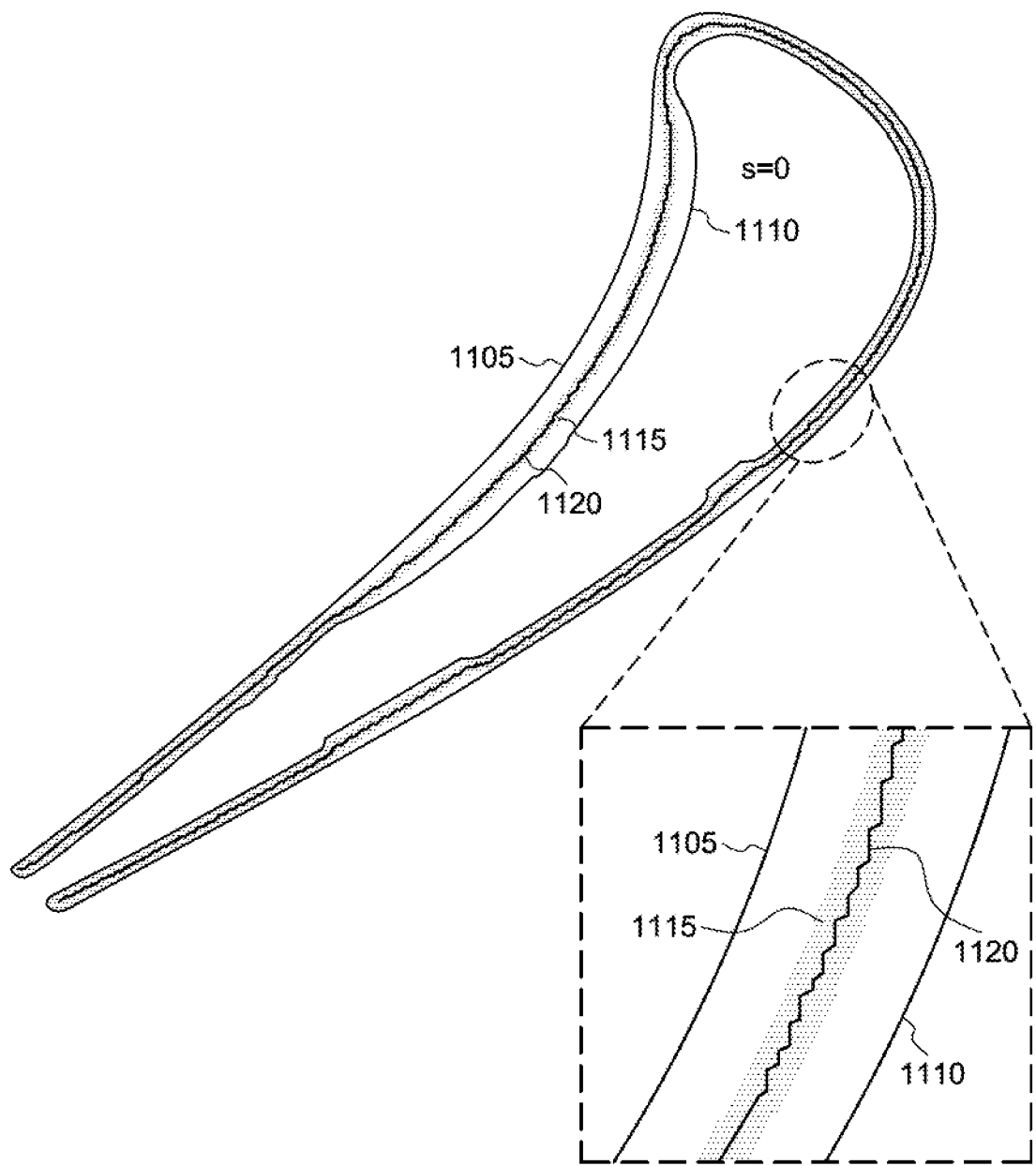
FIGS. 11A-11C are illustrative depictions of some aspects of contour-based hatching process, including spline smoothing, in accordance with some embodiments.
Figure 11B:
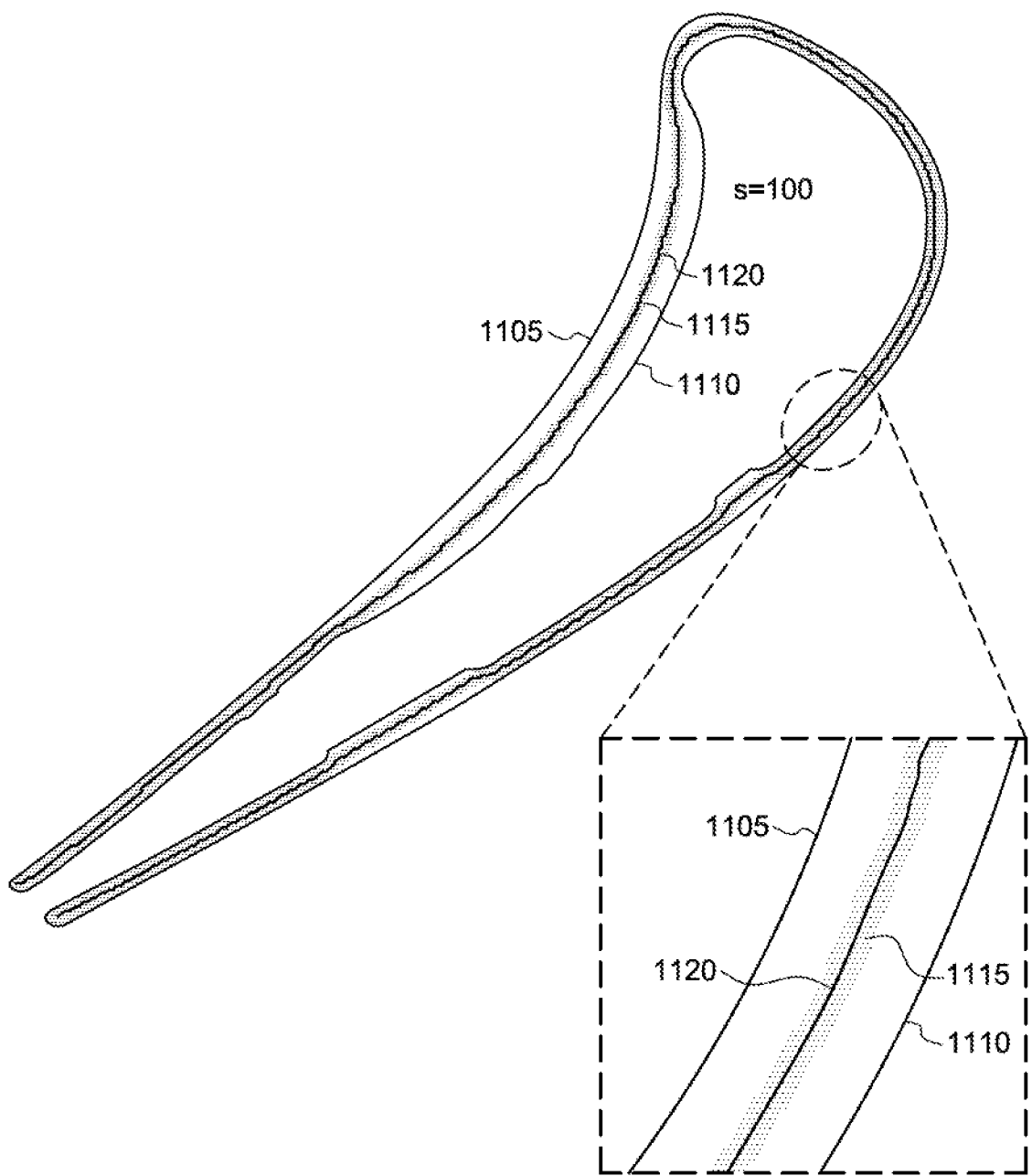
Figure 11C:
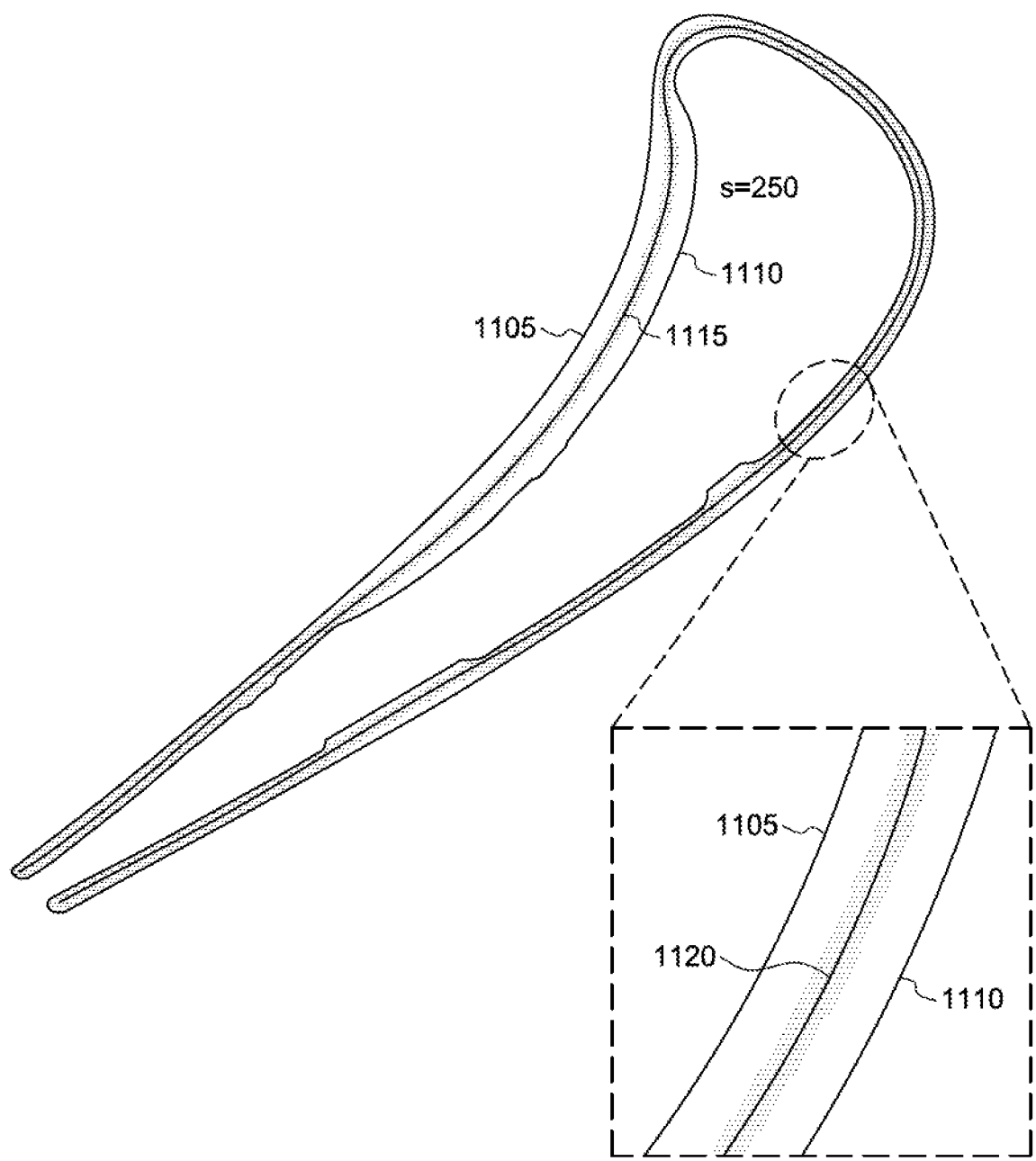

FIGS. 11A-11C demonstrate an example smoothing process, in some aspects and embodiments herein. In some embodiments, a smoothing process, operation, or technique might depend on a "s" parameter, where the unit of "s" is related to the pixel size of the raster scan of the part. In some embodiments, an example function to generate the spline may be expressed as (raster width*2)*(s^2). In FIG. 11A of a single layer of a part having a contour 1105, 1110, a skeleton 1115, and a spline 1120, no smoothing (e.g., s=0) has been applied to the spline. As shown in the detailed view thereof, the spline is very discontinuous (i.e., "jerky"). In FIG. 11B of the same single layer of the part having contour 1105, 1110, skeleton 1115, and spline 1120, "light" smoothing (e.g., s=100) has been applied to the spline. As shown in the detailed view of FIG. 11B, the spline is only mildly discontinuous relative to the contours of the part. In FIG. 11C of the part including contour 1105, 1110, skeleton 1115, and spline 1120, an "ideal" amount of smoothing (e.g., s=250) has been applied to the spline. As shown in the detailed view of FIG. 11C, the spline is continuous and even (i.e., smooth) relative to the contours of the part. In some embodiments herein, the level of smoothing depicted in FIG. 11C may preferably be used to generate the spline for each layer of a part. It is noted that the values for "s" in the examples of FIGS. 11A-11C are illustrative, not limiting herein.

Figure 12A:
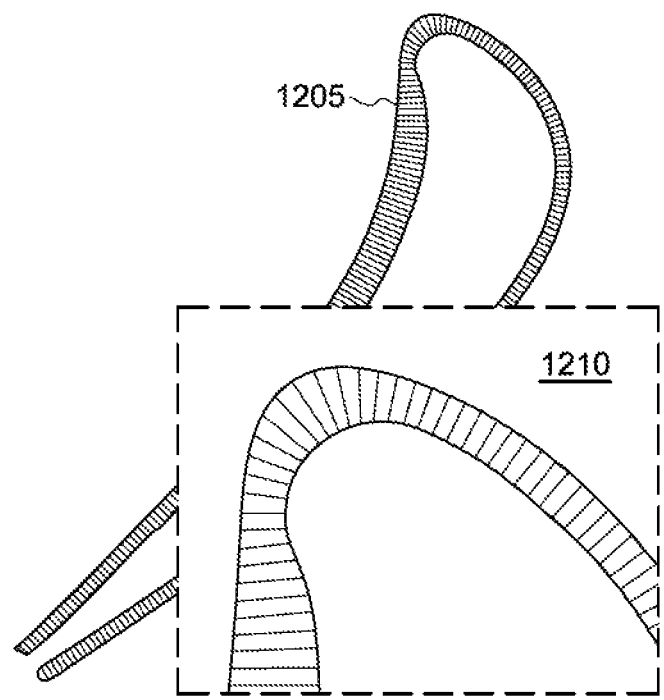
FIGS. 12A-12C are illustrative depictions of some aspects of contour-based hatching process, including inter-layer hatch angle rotation, in accordance with some embodiments.
Figure 12B:
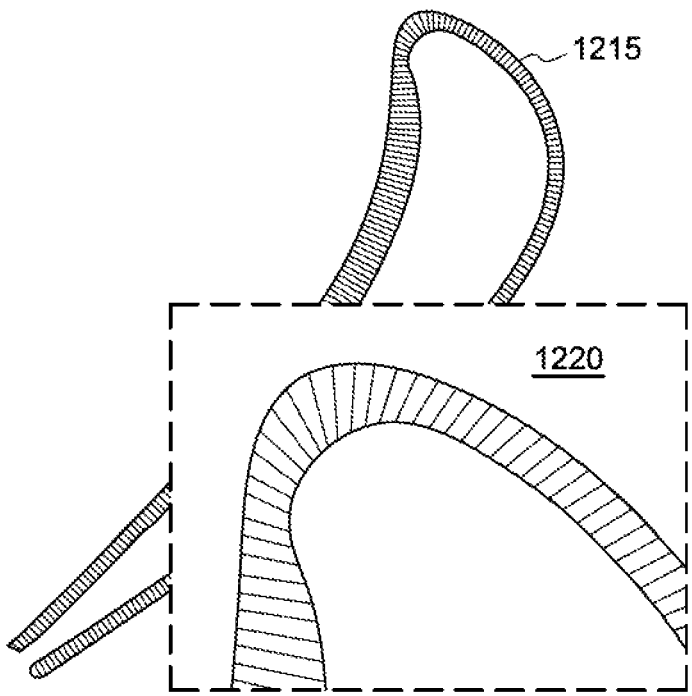
Figure 12C:
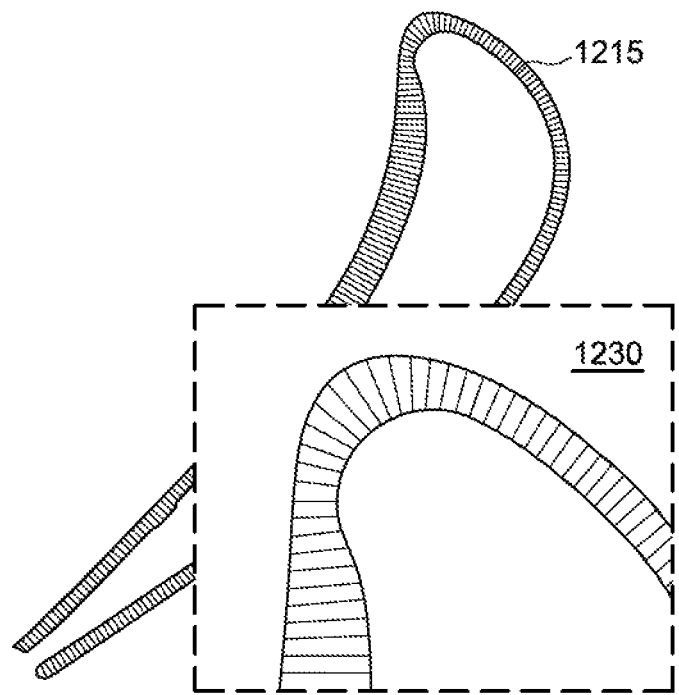

FIGS. 12A-12C demonstrate an example inter-layer hatch angle rotation process, in some aspects and embodiments herein. In some aspects, cracks may be more likely to form in areas of a part where hatches are built directly on top of each other in successive layers. In an effort to minimize such effect(s), the present disclosure includes a process to add an angular offset to the hatches generated by a contour-based hatching process herein in some embodiments. The disclosed inter-layer hatch angle rotation process operates, in some embodiments, to vary hatching away from an exact contour normal (or other predetermined angle), in a controlled and repeatable manner. In some embodiments, the offset can be fixed for hatches in a given layer and varied between layers such that the hatch angle for successive layers differ from each other.

In one example instance, a repeating pattern of 0 degrees, −15 degrees, and +15 may be used to vary the hatch angle between layers in a part. In FIG. 12A, 0 degrees is added to the normal hatch angle for hatches 1205, as further illustrated in detailed view 1210. In FIG. 12B, −15 degrees is added to the normal hatch angle for hatches 1215, as further illustrated in detailed view 1220. In FIG. 12C, +15 degrees is added to the normal hatch angle for hatches 1225, as further illustrated in detailed view 1230. It is noted that the example rotation pattern of FIGS. 12A-12C are merely illustrative and not limiting herein.

Figure 13A:
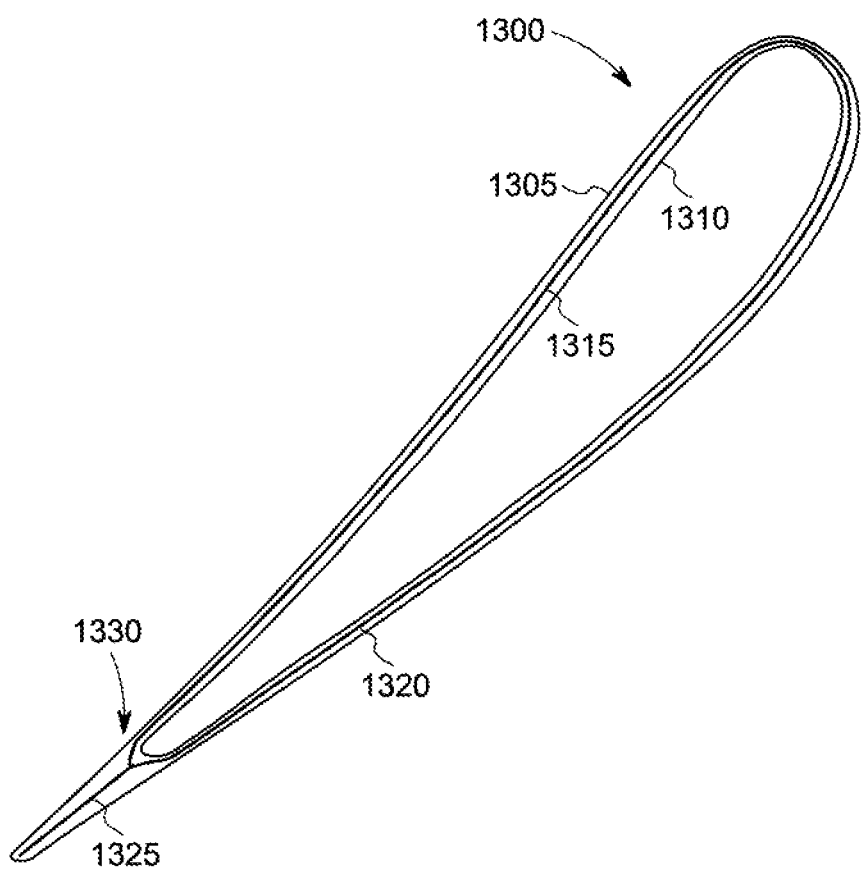
FIGS. 13A and 13B are illustrative depictions of some aspects of contour-based hatching process, including hatching in the vicinity of branch points, in accordance with some embodiments.
Figure 13B:
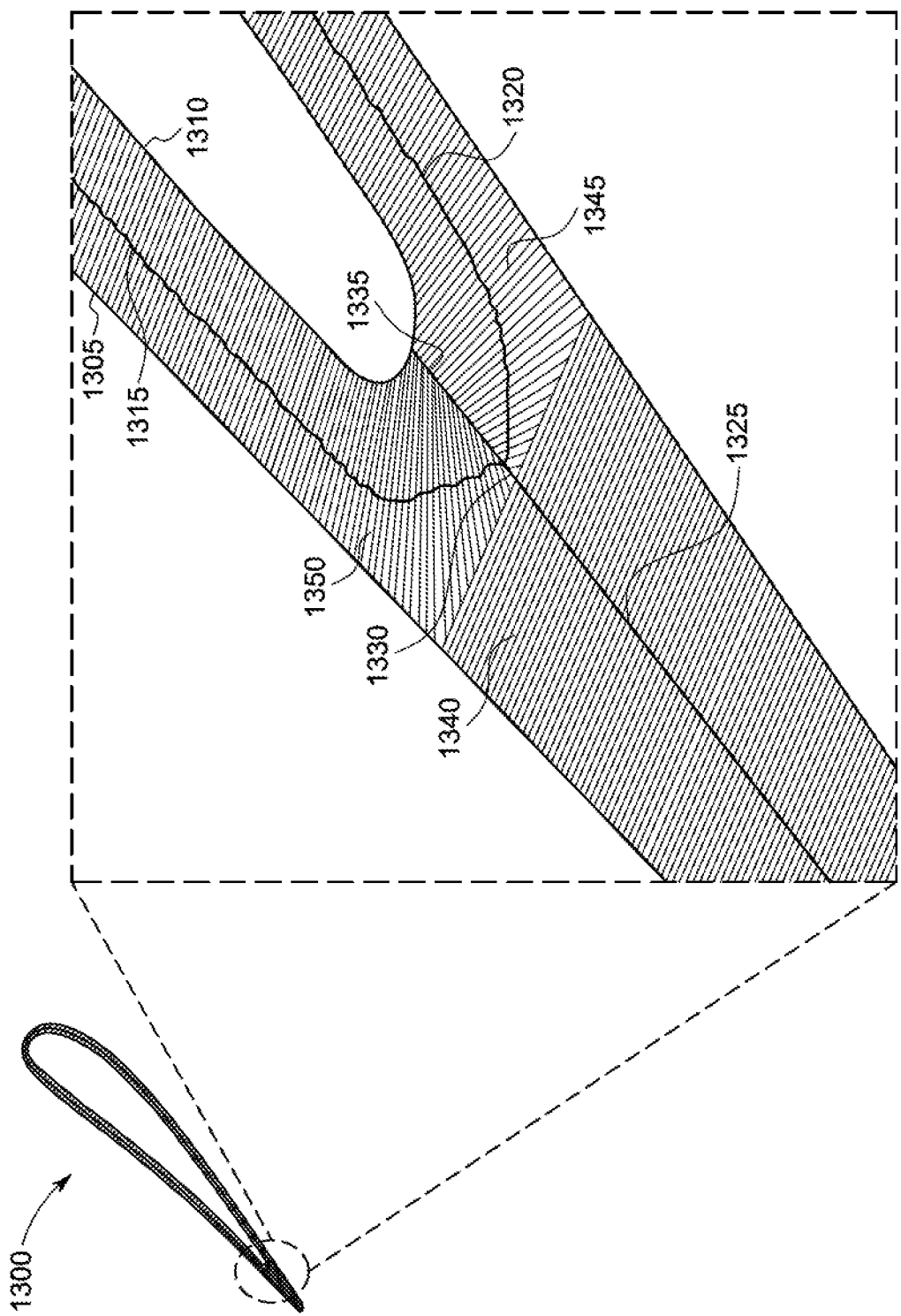
Figure 14:
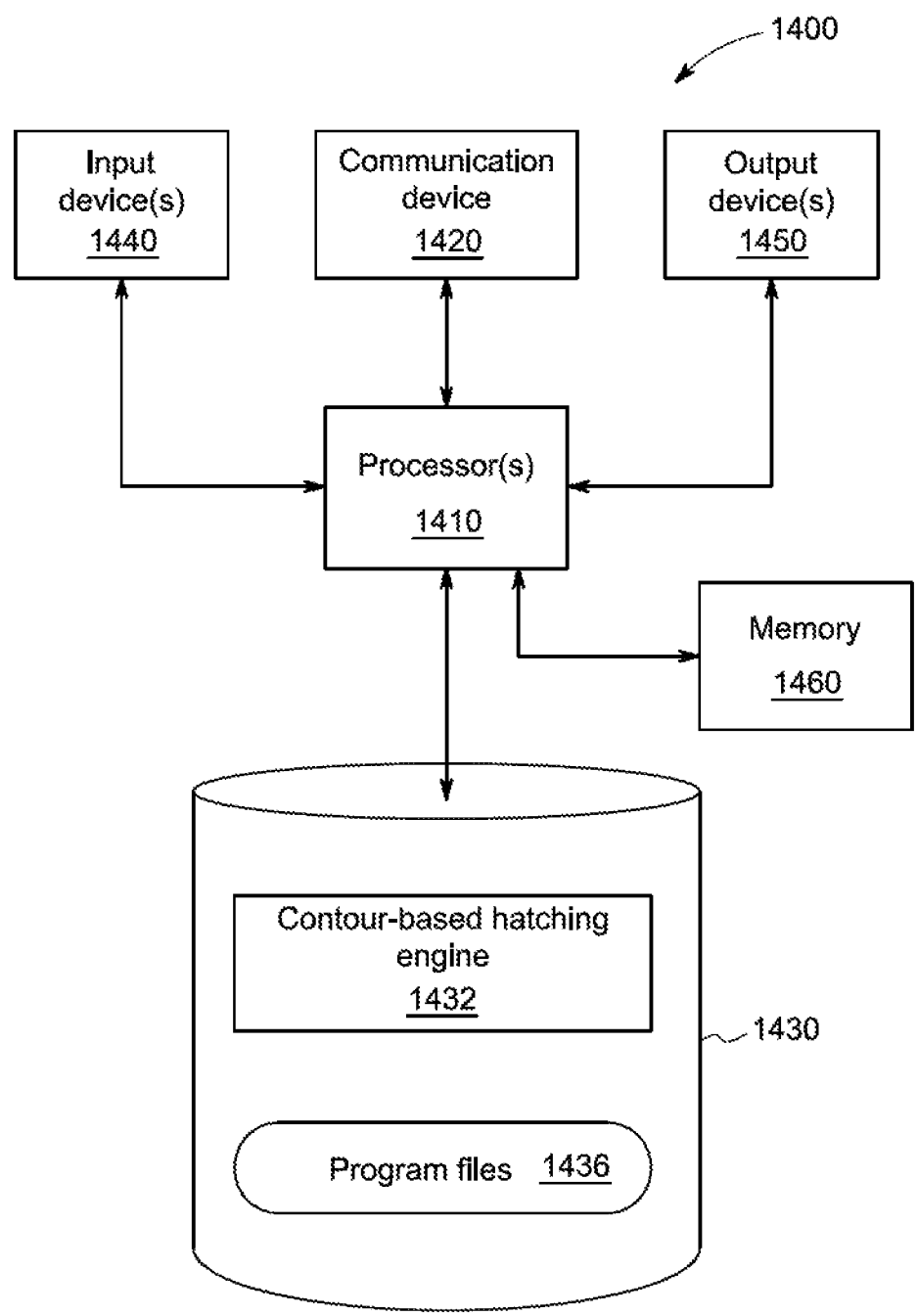
FIG. 14 is an illustrative depiction of a block diagram of computing system, according to some embodiments herein.

FIGS. 13A and 13B relate to a process of determining hatches for parts having one of more "branch" points. As disclosed herein, a branch point refers to an intersection of multiple branches or segments of a spline for a part, wherein the spline branches in three (3) or more directions and terminate at a branch point. In some aspects, a process of determining hatches for parts having one of more "branch" points may operate to specify or define how hatches from each of the multiple branches for a part should merge at a branch point, while avoiding overlapping hatches and unhatched areas.

FIG. 13A includes a rastered image of a layer of a part 1300 that includes a spline having multiple branches or segments. Part 1300 includes a part having contours 1305, 1310 and a spline that includes three (3) branches including spline segments 1315, 1320, and 1325 that terminate or merge at a single branch point 1330.

FIG. 13B is a detailed view of FIG. 13A and shows part 1300 that includes contours 1305, 1310 and the spline that includes three (3) branches including spline segments 1315, 1320, and 1325 that terminate or merge at branch point 1330. The hatches for part 1300 may be generated or otherwise determined by first identifying a branch point that merges three or more spline segments of a part. Upon identifying a branch point, if any, separate splines may be fit to an upper section and a lower section of each branch. In FIG. 13B, lower spline 1325 terminates at a lower end of the part without reconnecting to the spline of the part. In contrast, spline segments 1315 and 1320 loop around the part and reconnect at branch point 1330. Hatches for the lower spline 1325 may be defined by aligning hatch lines perpendicular to lower spline 1325. The hatches in this area of the part ends at the branch point and may be used in defining a new "internal contour" that other hatches should not overlap. Hatches for the upper spline may be defined by aligning hatch lines perpendicular to each of spline segments 1315 and 1320. The hatches in this region of the part may be truncated by both the upper-most hatch of the lower spline and an artificial barrier 1335 drawn from branch point 1330 to a nearest point of the inner contour of the part. In some aspects, artificial barrier 1335 is used to prevent gaps at the junction between the upper and lower hatch sets of part 1300.

System 1400 includes processor(s) 1410 operatively coupled to communication device 1420, data storage device 1430, one or more input devices 1440, one or more output devices 1450, and memory 1460. Communication device 1420 may facilitate communication with external devices, such as a data server and other data sources. Input device(s) 1440 may comprise, for example, a keyboard, a keypad, a mouse or other pointing device, a microphone, knob or a switch, an infra-red (IR) port, a docking station, and/or a touch screen. Input device(s) 1440 may be used, for example, to enter information into system 1400. Output device(s) 1450 may comprise, for example, a display (e.g., a display screen) a speaker, and/or a printer.

Data storage device 1430 may comprise any appropriate persistent storage device, including combinations of magnetic storage devices (e.g., magnetic tape, hard disk drives and flash memory), optical storage devices, Read Only Memory (ROM) devices, etc., while memory 1460 may comprise Random Access Memory (RAM), Storage Class Memory (SCM) or any other fast-access memory. Files including, for example, model representations of a part, output records (e.g., deviation calculations, etc.) of processes (e.g., process 200 and/or portions thereof) herein, and other data structures may be stored in data storage device 1430.

Contour-Based Hatching Engine 1432 may comprise program code executed by processor(s) 1410 (and within the execution engine) to cause system 1400 to perform any one or more of the processes (e.g., FIG. 3, process 300 and FIG. 7, process 700) or portions thereof disclosed herein. Embodiments are not limited to execution by a single apparatus. Data storage device 1430 may also store data and other program code 1436 for providing additional functionality and/or which are necessary for operation of system 1400, such as device drivers, operating system files, etc.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform methods disclosed herein, such as a method of determining a design a part and a combination of a thermal support structure and a structural support structure.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

What is claimed is:

1. A computer-implemented method, the method comprising:
    receiving a data model representation of a part, the data model representation including at least one layer of the part and inner and outer contours for the at least one layer;
    determining a hatch pattern for each layer of the at least one layer of the part, the hatch pattern for each layer being dependent on the inner and outer contours for each respective layer;
    generating a record of the determined hatch pattern for each layer, the record including locations for the hatch pattern for each layer; and
    saving the record of the determined hatch pattern for each layer of the part; and
    wherein the determining of the hatch pattern for each layer of the at least one layer of the part, comprises:
        determining a skeleton for each layer of the part, the skeleton being centrally located between the inner and outer contours of the part;
        fitting, for each layer of the part, a continuous spline over the skeleton for each layer of the part; and
        generating a plurality of hatches for each layer of the part, each of the plurality of hatches having a fixed hatch angle relative to the continuous spline for each respective layer of the part and the plurality of hatches for each layer of the part comprising the determined hatch pattern for each layer of the part.

2. The method of claim 1, wherein the fixed hatch angle is about normal to the continuous spline.

3. The method of claim 1, wherein the plurality of hatches for each layer of the part are spaced apart at a fixed interval.

4. The method of claim 1, wherein the fixed hatch angle for successive layers of the part differ from each other between about ±10 degrees to about ±170 degrees.

5. The method of claim 1, further comprising:
    identifying whether one or more branch point exists for the determined skeleton for each layer of the part, the branch point defining a terminal end of a plurality of segments of the skeleton; and
    generating, for each of the plurality of segments defined by each identified branch point, a plurality of hatches each having a fixed hatch angle relative to the continuous spline for each segment of the respective layer of the part.

6. The method of claim 5, wherein the plurality of hatches generated for each of the plurality of segments terminates a junction between the segments.

7. The method of claim 1, wherein generating the record of the determined hatch pattern comprises generating, via a contour based hatching engine, the record of the determined hatch pattern, and further comprising using the record for additively manufacturing the part.

8. A system comprising
    a memory storing processor-executable instructions; and
    one or more processors to execute the processor-executable instructions to:
        receive a data model representation of a part, the data model representation including at least one layer of the part and inner and outer contours for the at least one layer;
        determine a hatch pattern for each layer of the at least one layer of the part, the hatch pattern for each layer being dependent on the inner and outer contours for each respective layer;
        determine a skeleton for each layer of the part, the skeleton being centrally located between the inner and outer contours of the part;
        fit, for each layer of the part, a continuous spline over the skeleton for each layer of the part;
        generate a plurality of hatches for each layer of the part, each of the plurality of hatches having a fixed hatch angle relative to the continuous spline for each respective layer of the part and the plurality of hatches for each layer of the part comprising the determined hatch pattern for each layer of the part;
        generate a record of the determined hatch pattern for each layer, the record including locations for the hatch pattern for each layer; and
        save the record of the determined hatch pattern for each layer of the part.

9. The system of claim 8, wherein the fixed hatch angle is about normal to the continuous spline.

10. The system of claim 8, wherein the plurality of hatches for each layer of the part are spaced apart at a fixed interval.

11. The system of claim 8, wherein the fixed hatch angle for successive layers of the part differ from each other between about ±10 degrees to about ±170 degrees.

12. The system of claim 8, further comprising the one or more processors to execute the processor-executable instructions to:
    identify whether one or more branch point exists for the determined skeleton for each layer of the part, the branch point defining a terminal end of a plurality of segments of the skeleton; and
    generate, for each of the plurality of segments defined by each identified branch point, a plurality of hatches each having a fixed hatch angle relative to the continuous spline for each segment of the respective layer of the part.

13. The system of claim 12, wherein the plurality of hatches generated for each of the plurality of segments terminates a junction between the segments.

14. The system of claim 8, wherein the one or more processors execute the processor-executable instructions to:
determine the hatch pattern for each layer via a contour-based hatching engine; and
use the record to additively manufacture the part.

15. A non-transitory computer-readable medium storing instructions that, when executed by a computer processor, cause the computer processor to perform a method comprising:
receiving a data model representation of a part, the data model representation including at least one layer of the part and inner and outer contours for the at least one layer;
determining a hatch pattern for each layer of the at least one layer of the part, the hatch pattern for each layer being dependent on the inner and outer contours for each respective layer;
determining a skeleton for each layer of the part, the skeleton being centrally located between the inner and outer contours of the part;
fitting, for each layer of the part, a continuous spline over the skeleton for each layer of the part; and
generating a plurality of hatches for each layer of the part, each of the plurality of hatches having a fixed hatch angle relative to the continuous spline for each respective layer of the part and the plurality of hatches for each layer of the part comprising the determined hatch pattern for each layer of the part;
generating a record of the determined hatch pattern for each layer, the record including locations for the hatch pattern for each layer; and
saving the record of the determined hatch pattern for each layer of the part.

16. The medium of claim 15, wherein the fixed hatch angle is about normal to the spline.

17. The medium of claim 15, wherein the plurality of hatches for each layer of the part are spaced apart at a fixed interval.

18. The medium of claim 15, wherein the fixed hatch angle for successive layers of the part differ from each other between about ±10 degrees to about ±170 degrees.

19. The medium of claim 15, further storing instructions that, when executed by the computer processor, cause the computer processor to perform the method comprising:
identifying whether one or more branch point exists for the determined skeleton for each layer of the part, the branch point defining a terminal end of a plurality of segments of the skeleton; and
generating, for each of the plurality of segments defined by each identified branch point, a plurality of hatches each having a fixed hatch angle relative to the spline for each segment of the respective layer of the part.

20. The medium of claim 15, further storing instructions that, when executed by the computer processor, cause the computer processor to perform the method comprising:
determining the hatch pattern for each layer via a contour-based hatching engine; and
using the record to additively manufacture the part.

* * * * *